(12) United States Patent
Park

(10) Patent No.: US 7,678,611 B2
(45) Date of Patent: Mar. 16, 2010

(54) SPACER DIE STRUCTURE AND METHOD FOR ATTACHING

(75) Inventor: Seung Wook Park, Seoul (KR)

(73) Assignee: ChipPAC, Inc., Fremont, CA (US)

( * ) Notice: Subject to any disclaimer, the term of this patent is extended or adjusted under 35 U.S.C. 154(b) by 151 days.

(21) Appl. No.: 11/464,631

(22) Filed: Aug. 15, 2006

(65) Prior Publication Data

US 2006/0292831 A1    Dec. 28, 2006

Related U.S. Application Data

(60) Division of application No. 11/087,375, filed on Mar. 23, 2005, now Pat. No. 7,190,058, which is a continuation-in-part of application No. 10/959,659, filed on Oct. 6, 2004, now abandoned.

(60) Provisional application No. 60/558,670, filed on Apr. 1, 2004.

(51) Int. Cl.
  *H01L 21/50* (2006.01)
(52) U.S. Cl. .............. 438/114; 438/464; 257/E21.499
(58) Field of Classification Search .......... 438/106, 438/110, 113, 114, 455, 457–460, 462–465; 257/E21.499
See application file for complete search history.

(56) References Cited

U.S. PATENT DOCUMENTS

| | | | |
|---|---|---|---|
| 5,140,404 A | 8/1992 | Fogal et al. | |
| 5,218,229 A | 6/1993 | Farnworth | |
| 5,323,060 A | 6/1994 | Fogal et al. | |
| 5,372,883 A | 12/1994 | Shores | |
| 5,476,565 A | 12/1995 | Cavasin | |
| 5,776,799 A | 7/1998 | Song et al. | |

(Continued)

FOREIGN PATENT DOCUMENTS

JP    2001085715 A    3/2001

OTHER PUBLICATIONS

Lintec Semiconductor-Related Products Web Site, "Adwill Semiconductor-Related Products", 1 page, http://www.lintec.co.jp/e-dept/english/adwill/adwill.html, downloaded Mar. 1, 2004.

(Continued)

*Primary Examiner*—Marcos D. Pizarro
(74) *Attorney, Agent, or Firm*—Robert D. Atkins

(57) ABSTRACT

A semiconductor spacer structure comprises in order a backgrinding tape layer, a spacer adhesive layer, a semiconductor spacer layer, an optional second spacer adhesive layer, a dicing tape layer. In a first method a spacer wafer having first and second sides, a backgrinding tape layer and a spacer adhesive layer between the first side and the backgrinding tape layer, is obtained. The second side is background and secured to a dicing tape. The backgrinding tape is removed and the resulting structure is diced to create spacer/adhesive die structures. A second method backgrinds the second side with the backgrinding tape layer at the first side. A protective cover layer is secured to the second side with a spacer adhesive layer therebetween. The backgrinding tape layer is removed and the remaining structure is secured to a dicing tape with the protective cover layer exposed. The protective cover layer is removed and the resulting structure is diced thereby creating spacer/adhesive die structures. The thickness of the second spacer adhesive layer may be selected to accommodate an uneven support surface.

16 Claims, 3 Drawing Sheets

U.S. PATENT DOCUMENTS

| | | | |
|---|---|---|---|
| 5,945,733 | A | 8/1999 | Corbett et al. |
| 5,962,097 | A * | 10/1999 | Yamamoto et al. ......... 428/40.1 |
| 6,251,513 | B1 | 6/2001 | Rector et al. |
| 6,265,763 | B1 | 7/2001 | Jao et al. |
| 6,333,562 | B1 | 12/2001 | Lin |
| 6,340,846 | B1 | 1/2002 | LoBianco et al. |
| 6,351,028 | B1 | 2/2002 | Akram |
| 6,388,313 | B1 | 5/2002 | Lee et al. |
| 6,472,758 | B1 | 10/2002 | Glenn et al. |
| 6,503,821 | B2 | 1/2003 | Farquhar et al. |
| 6,551,906 | B2 * | 4/2003 | Oka .......................... 438/465 |
| 6,569,709 | B2 | 5/2003 | Derderian |
| 6,593,662 | B1 | 7/2003 | Pu et al. |
| 6,620,651 | B2 | 9/2003 | He et al. |
| 6,650,009 | B2 | 11/2003 | Her et al. |
| 6,803,293 | B2 * | 10/2004 | Yamamoto .................. 438/459 |
| 6,885,093 | B2 | 4/2005 | Lo et al. |
| 6,979,593 | B2 * | 12/2005 | Kawakami .................. 438/110 |
| 2003/0038357 | A1 | 2/2003 | Derderian |
| 2003/0038374 | A1 | 2/2003 | Shim et al. |
| 2003/0178710 | A1 | 9/2003 | Kang et al. |
| 2004/0026768 | A1 | 2/2004 | Taar et al. |
| 2004/0097054 | A1 * | 5/2004 | Abe ........................... 438/460 |
| 2005/0090050 | A1 | 4/2005 | Shim et al. |

OTHER PUBLICATIONS

Lintec Semiconductor-Related Products Web Site, "Products for Dicing Process", 2 pages, http://www.lintec.co.jp/e-dept/english/adwill/diceproces.html, downloaded Mar. 1, 2004.

Lintec Semiconductor-Related Products Web Site, "Products for back-grinding process", 1 page, http://www.lintec.co.jp/e-dept/english/adwill/bgproces.html, Downloaded Mar. 1, 2004.

* cited by examiner

SPACER DIE STRUCTURE AND METHOD FOR ATTACHING

CROSS-REFERENCE TO RELATED APPLICATIONS

This Application is a Division of U.S. patent application Ser. No. 11/087,375, filed Mar. 23, 2005, which is a continuation in part of U.S. patent application Ser. No. 10/959,659, filed Oct. 6, 2004, which application claims priority from U.S. Provisional Application No. 60/558,670, filed Apr. 1, 2004, all applications titled "Spacer die structure and method for attaching".

BACKGROUND

The present invention relates to semiconductor spacer structures used in the fabrication of multi-chip modules, and to the manufacturing method of such packages.

To obtain the maximum function and efficiency from the minimum package, various types of increased density packages have been developed. Among these various types of packages is the so-called multi-chip module, multi-chip package or stacked chip package. A multi-chip module includes one or more integrated circuit semiconductor chips, often referred to as circuit die, stacked one onto another to provide the advantages of light weight, high density, and enhanced electrical performance. The multi-chip packages may contain all circuit die or a mixture of circuit die and spacer die, the spacer die typically being used to separate circuit die.

Semiconductor chip packaging process typically begins with wafer dicing, that is, sawing a semiconductor wafer to separate the wafer into individual semiconductor devices or chips. Before sawing, a wafer mounting tape is typically attached to the backside of the wafer. The wafer mounting tape keeps the chips together after the sawing.

The semiconductor chip is typically adhered to a previously mounted chip or to the substrate with a paste (typically an epoxy paste adhesive) or a film adhesive. Generally, paste adhesives have been used more often than film adhesives. However, some multi-chip modules are more successfully fabricated using film adhesives because the thickness of adhesive film is uniform so that there is minimal or no tilt of the semiconductor chips and no fillet of adhesive encircling the semiconductor chip. Moreover, no resin is bled so that it is suitable for multi chip stacking and packages with tight design tolerances or thinner chip.

In one method of fabricating a multi-chip module using film adhesive, an adhesive film is laminated directly to the backside of the semiconductor wafer and then the wafer is diced into individual semiconductor chips using conventional wafer dicing equipment. For stacking the semiconductor chips, each chip is lifted by a chip-bonding tool, which is usually mounted at the end of a pick-and-place device, and mounted onto the substrate or onto a semiconductor chip mounted previously. This method requires special film laminating equipment. However, it can shorten fabrication time and lower cost because the paste-dispensing process is not needed.

After the chip mounting process, bonding pads of the chips are connected to bonding pads of the substrate with Au or Al wires during a wire bonding process to create an array of semiconductor chip devices. Finally, the semiconductor chips and their associated wires connected to the substrate are encapsulated, typically using an epoxy-molding compound, to create an array of encapsulated semiconductor devices. The molding compound protects the semiconductor devices from the external environment, such as physical shock and humidity. After encapsulation, the encapsulated devices are separated, typically using a laser saw, into individual semiconductor chip packages.

SUMMARY

A first aspect of the present invention is directed to a semiconductor spacer structure comprising a removable layer, followed by a spacer adhesive layer, followed by a semiconductor spacer layer, followed by a dicing tape layer. The removable layer may comprise, for example, a backgrinding tape layer or a protective cover layer. The semiconductor spacer structure may also comprise a second spacer adhesive layer between the semiconductor spacer layer and the dicing tape layer. The semiconductor spacer structure may further comprise a release adhesive at an interface between the removable layer and the spacer adhesive layer to facilitate removal of the removable layer from the spacer adhesive layer.

A second aspect of the present invention is directed to a method for attaching a semiconductor spacer die to a support surface. A first subassembly, comprising a spacer wafer having first and second sides, a backgrinding tape layer and a spacer adhesive layer between the first side and the backgrinding tape layer, is obtained. The second side of the spacer wafer is background to create a second subassembly. The second subassembly is secured to a dicing tape with the backgrinding tape layer exposed. The backgrinding tape is removed from the spacer adhesive layer. An array of grooves is formed through the spacer adhesive layer and to at least the dicing tape layer to create spacer/adhesive die structures. The spacer/adhesive die structures comprise spacer die and adhesive. A spacer/adhesive die structure is secured to a support surface with the spacer adhesive layer exposed. A second spacer adhesive layer may be adhered to the second side of the spacer wafer after the backgrinding step and before the first securing step, whereby the second spacer adhesive layer can be used to secure the spacer/adhesive die structure to the support surface. The second spacer adhesive layer may be selected to accommodate an uneven support surface of a semiconductor substrate.

A third aspect of the invention is directed to a method for assembling a multi-chip semiconductor package. A first subassembly, comprising a semiconductor spacer wafer having first and second sides, a backgrinding tape layer and a spacer adhesive layer between the first side and the backgrinding tape layer, is obtained. The second side of the spacer wafer is background to create a second subassembly. The second subassembly is secured to a dicing tape with the backgrinding tape layer exposed. The backgrinding tape is removed from the spacer adhesive layer. An array of grooves, extending from the spacer adhesive layer to at least the dicing tape layer, is formed to create spacers/adhesive die structures. The spacer/adhesive die structures comprise spacer die and adhesive. A spacer/adhesive die structure is secured to a support surface with the spacer adhesive layer exposed. A second circuit die is positioned against the adhesive of the spacer/adhesive die structure to secure the second circuit die to the spacer die. The method may also include adhering a second spacer adhesive layer to the second side of the spacer wafer after the backgrinding step and before the first securing step, whereby the second spacer adhesive layer can be used to secure the spacer/adhesive die structure to the support surface during the second securing step.

A fourth aspect of the invention is directed to a method for attaching a semiconductor spacer die to a support surface. A first subassembly comprises a spacer wafer having first and second sides and a backgrinding tape layer at the first side. The second side of the spacer wafer is background to create a second subassembly. A protective cover layer is secured to the second side of the spacer wafer with a spacer adhesive layer therebetween to create a third subassembly. The backgrinding tape layer is removed from the first side of the spacer wafer of the third subassembly to create a fourth subassembly. The fourth subassembly is secured to a dicing tape with the protective cover layer exposed. The protective cover layer is removed from the spacer adhesive layer. An array of grooves is formed to extend from the spacer adhesive layer to at least the dicing tape layer thereby creating spacer/adhesive die structures. The spacer/adhesive die structures comprise spacer die and adhesive. A spacer/adhesive die structure is secured to a support surface with the spacer adhesive layer exposed. In some embodiments a second spacer adhesive layer is secured to the first side of the spacer wafer after the backgrinding step and before the second securing step, whereby the second spacer adhesive layer can be used to secure the spacer/adhesive die structure to the support surface. The thickness of the second spacer adhesive layer may be selected to accommodate an uneven support surface. For example, the second spacer adhesive layer may be at least about 50% thicker than the first spacer adhesive layer.

A fifth aspect of the invention is directed to a method for assembling a multi-chip semiconductor package. A first subassembly, comprising a semiconductor spacer wafer having first and second sides and a backgrinding tape layer at the first side, is obtained. The second side of the spacer wafer is background to create a second subassembly. A protective cover layer is secured to the second side of the spacer wafer with a spacer adhesive layer therebetween to create a third subassembly. The backgrinding tape layer is removed from the first side of the spacer wafer of the third subassembly to create a fourth subassembly. The fourth subassembly is secured to a dicing tape with the protective cover layer exposed. The protective cover layer is removed from the spacer adhesive layer. An array of grooves, extending from the spacer adhesive layer to at least the dicing tape layer, is formed to create spacers/adhesive die structures, the spacer/adhesive die structures comprising spacer die and adhesive. A spacer/adhesive die structure is secured to a support surface with the spacer adhesive layer exposed. A second, circuit die is positioned against the adhesive of the spacer/adhesive die structure to secure the second, circuit die to the spacer die. In some embodiments a second spacer adhesive layer is secured to the first side of the spacer wafer after the backgrinding step and before the second securing step, whereby the second spacer adhesive layer is used to secure the spacer/adhesive die structure to the support surface during the third securing step. The thickness of the second spacer adhesive layer may be selected to accommodate an uneven support surface of a semiconductor substrate.

Various features and advantages of the invention will appear from the following description in which the preferred embodiments have been set forth in detail in conjunction with the accompanying drawings.

BRIEF DESCRIPTION OF THE DRAWINGS

FIG. 11 illustrates a second spacer adhesive layer mounted to the second, background side of the spacer wafer of the second subassembly of FIG. 4; and FIGS. 12-17 are similar to FIGS. 5 and 7-10 showing the creation of an adhesive/spacer/adhesive die structure in FIG. 16 to create the multi-chip module of FIG. 17.

FIG. 18 illustrates a spacer wafer having a backgrinding tape layer on a first side and suggests backgrinding the second, non-circuit side of the spacer wafer;

FIG. 19 shows the structure of FIG. 18 with a protective cover layer secured to the second side of the wafer with a spacer adhesive layer therebetween;

FIG. 20 shows removal of the backgrinding tape layer from the first side of the wafer;

FIG. 21 illustrates the structure of FIG. 20 secured to a dicing tape with the protective cover layer exposed; and FIG. 22 shows removal of the protective cover layer from the structure of FIG. 21, after which the remaining structure may be processed in a manner similar to that shown in FIGS. 14-17.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
FIG. 1 is a side view of a spacer wafer, that is a semiconductor wafer to be diced into individual spacer die.
Figure 2:
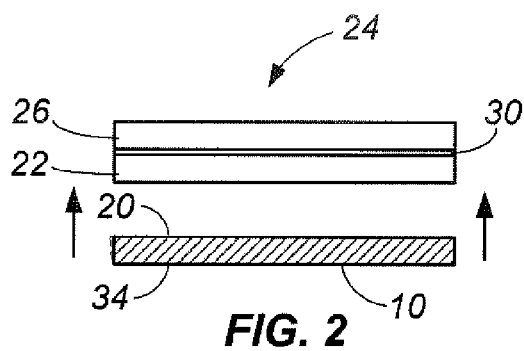
FIG. 2 illustrates bonding of a first side of the spacer wafer of FIG. 1 to the spacer adhesive layer of a backgrinding tape assembly.
Figure 9:
FIG. 9 illustrates an individual spacer/adhesive die structure.

FIG. 1 is a side view of a spacer wafer 10. Spacer wafers are semiconductor wafers which will be diced into individual spacer die 12, see FIG. 9. Spacer die 12 are typically used to separate circuit die 14, 16 in a multi-chip package 18. FIG. 2 illustrates bonding of a first side 20 of spacer wafer 10 to spacer adhesive layer 22 of a backgrinding tape assembly 24. Spacer adhesive layer 22 is typically a dielectric film adhesive, such as available from Lintec Corporation as Lintec LE5000. Assembly 24 has a backgrinding tape layer 26 releasably adhered to spacer adhesive layer 22 by a release adhesive 30. As is described below, release adhesive 30 is designed to permit backgrinding tape layer 26 to separate from adhesive layer 22. However, release adhesive 30 is formulated so as not to interfere with the adhesive properties and action of layer 22 during or after subsequent processing steps.

Figure 3:
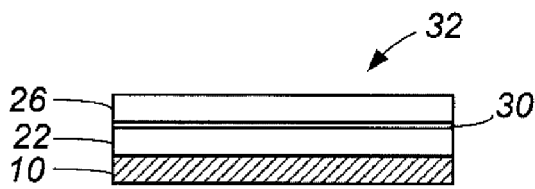
FIG. 3 illustrates a first subassembly created from the structure of FIG. 2 and ready for backgrinding.
Figure 4:
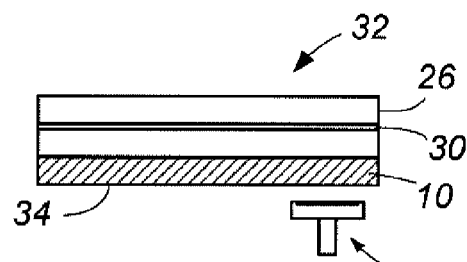
FIG. 4 shows backgrinding of the second side of the spacer wafer of the subassembly of FIG. 3 to create a second subassembly.

A first subassembly 32, shown in FIG. 3, is created from the structure of FIG. 2 and is ready for backgrinding. FIG. 4 shows backgrinding at 35 of the second side 34 of spacer wafer 10 of first subassembly 32 to create a second subassembly 36. Providing both backgrinding tape layer 26, release adhesive 30 and spacer adhesive layer 22, instead of just backgrinding tape layer 26 and release adhesive 30, provides additional protection for wafer 10 during the backgrinding operation. It also facilitates assembly of multi-chip module 18 as described below.

Figure 5:
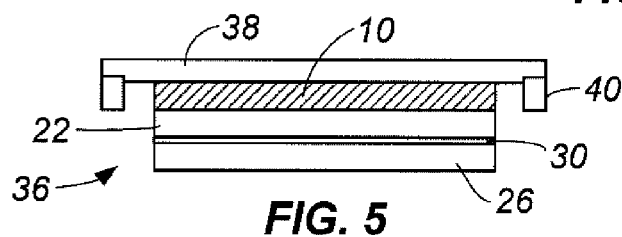
FIG. 5 illustrates the second subassembly of FIG. 4 with the background second side of the spacer wafer adhered to a dicing tape.
Figure 6:
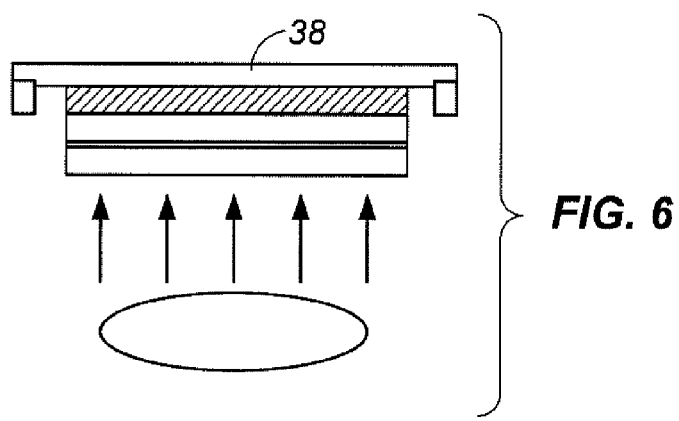
FIG. 6 illustrates the application of heat or UV radiation to the structure of FIG. 5.
Figure 7:
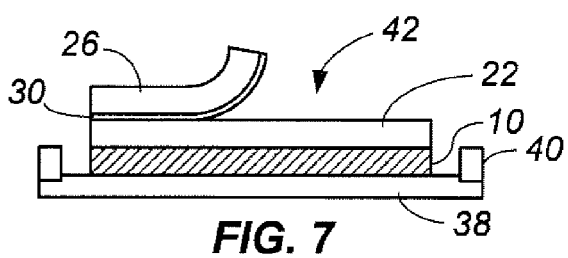
FIG. 7 shows the backgrinding tape layer being removed from the spacer adhesive layer of FIG. 6 to create a third subassembly.

The background second side 34 of spacer wafer 10 of second subassembly 36 of FIG. 4 is shown in FIG. 5 adhered to a dicing tape 38 within a ring frame 40. FIG. 6 illustrates the application of heat or UV radiation to help reduce the binding strength of the release adhesive 30 between backgrinding tape layer 26 and spacer adhesive layer 22 during the backgrinding tape removal step of FIG. 7. The choice of UV or heat, or the need for any type of activity to reduce the adhesive binding strength of release adhesive 30, depends, at least in part, on the composition of release adhesive 30 and of spacer adhesive layer 22, the processing environment and the type of surface being bonded. FIG. 7 shows backgrinding tape layer 26 being removed from spacer adhesive layer 22 of FIG. 6 to create a third subassembly 42. Backgrinding tape layer 26 may be removed using, for example, equipment also sold by Tokyo Seimitsu Co Ltd. (TSK) of Tokyo, Japan.

Figure 8:
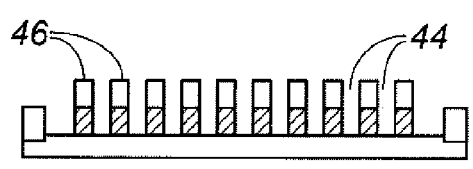
FIG. 8 shows the third subassembly of FIG. 7 after an array of grooves has been formed therein to create a plurality of spacer/adhesive die structures.

After removal of backgrinding tape layer 26, an array of grooves 44 is formed in third subassembly 42 of FIG. 7. See FIG. 8. Spacer/adhesive die structures 46 are illustrated with a greatly exaggerated thickness in FIG. 8 for purpose of illustration. This typically accomplished using a laser dicing saw; conventional dicing saw equipment is sold by Disco Corporation of Tokyo, Japan. This creates a plurality of spacer/adhesive die structures 46. Spacer/adhesive die structures 46 comprise spacer die 12 and adhesive 48. See FIG. 9. The edges of adhesive 48 are defined by this dicing step.

Figure 10:
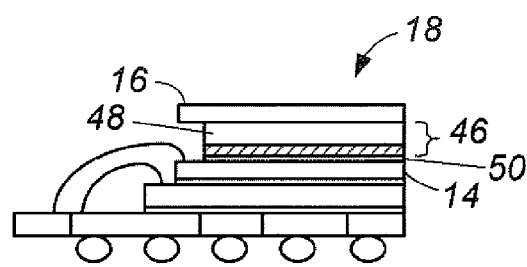
FIG. 10 illustrates a multi-chip module in which the spacer/adhesive die structure of FIG. 9 has been used to mount a third circuit die to a second circuit die.

FIG. 10 illustrates multi-chip module 18 with spacer die 12 secured to the second circuit die by a bonding adhesive 60. This may be accomplished using, for example, conventional die attach equipment, such as available from Esec of Cham, Switzerland as Esec 2008. Bonding adhesive 50 may be, for example, conventional or unconventional film or paste adhesive applied to second circuit die 14. The spacer/adhesive die structure 46 of FIG. 9 has been used to mount third circuit die 16 at a position spaced-apart above a second circuit die 14 without the need for any additional adhesive application steps, such as is needed if an adhesive paste or an adhesive film is applied between a spacer die and third circuit die 16. Any residual release adhesive 30 does not materially affect the bond between spacer die 12 and circuit die 16 created by adhesive 48.

Figure 11:
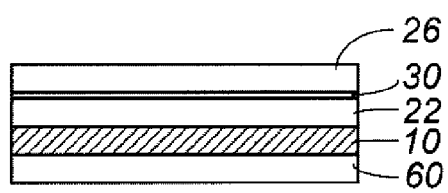
FIGS. 11-17 illustrate an alternative embodiment of the invention.
Figure 12:
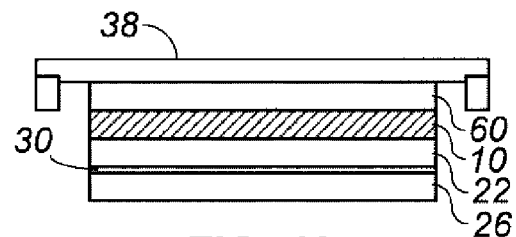
Figure 13:
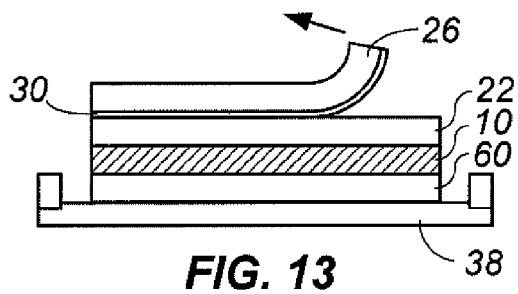
Figure 14:
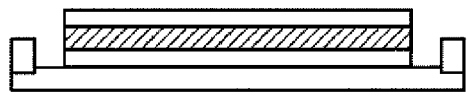
Figure 15:
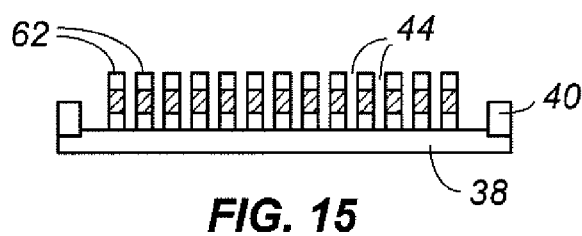
Figure 16:
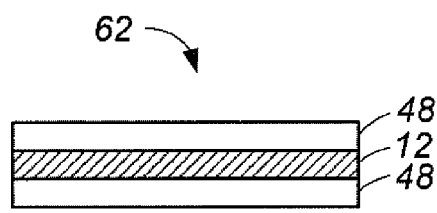
Figure 17:
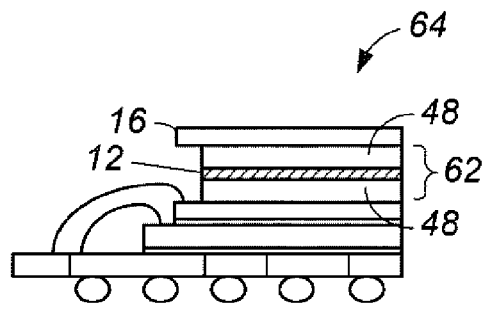

FIGS. 11-17 illustrate an alternative embodiment of the invention with like reference numbers referring to like elements. A second spacer adhesive layer 60 is shown in FIG. 11 adhered to the second, background side 34 of spacer wafer 10 of second subassembly 36 of FIG. 4. FIGS. 12-17 are similar to FIGS. 5 and 7-10 and show the creation of an adhesive/spacer/adhesive die structure 62 in FIG. 16 to create multi-chip module 64 of FIG. 17. If desired or necessary, a process to reduce the binding strength of release adhesive 30, as shown in FIG. 6, may also be used. The existence of adhesive 48 on both sides of spacer die 12 of FIG. 16 eliminates the need to provide bonding adhesive 50 between, for example, second circuit die 14 and spacer die 12.

Figure 18:
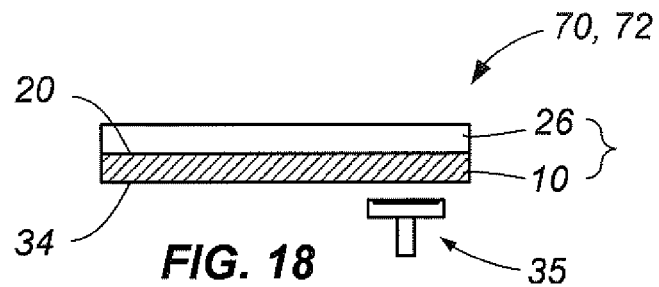
FIGS. 18-22 illustrate some of the steps taken during the manufacturer of a further alternative embodiment of the invention.
Figure 19:
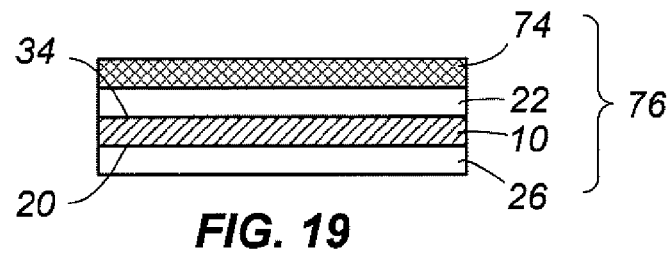
Figure 20:
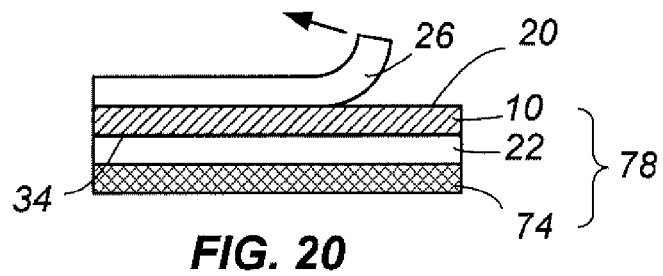
Figure 21:
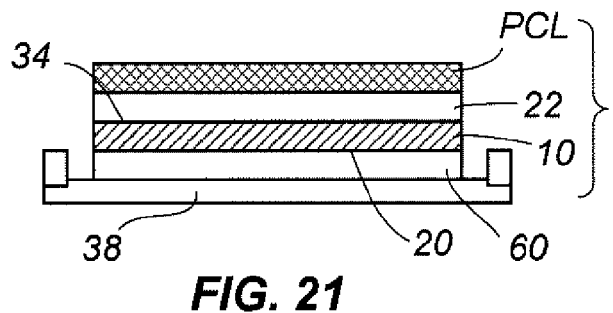
Figure 22:
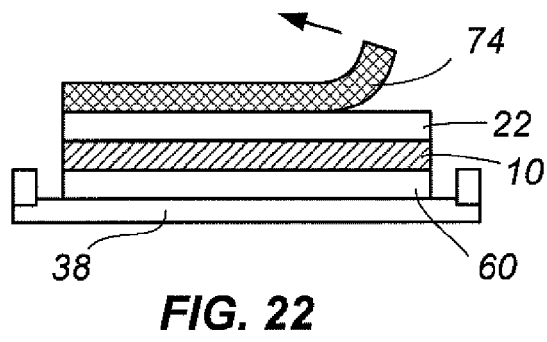

FIGS. 18-22 illustrate another alternative embodiment of the invention with like reference numbers referring to like elements. FIG. 18 illustrates a first subassembly 70 comprising semiconductor spacer wafer 10 having first and second sides 20, 34 and backgrinding tape layer 26 at the first side. Second side 34 of spacer wafer 10 is background at 35 to create a second subassembly 72. A protective cover layer 74 is secured to second side 34 with spacer adhesive layer 22 therebetween to create a third subassembly 76; see FIG. 19. Protective cover layer 74, which may be a conventional release liner type of layer, is used to help protect the structure during processing. As suggested in FIG. 20, backgrinding tape layer 26 is removed from first side 20 of spacer wafer 10 in third subassembly 76 to create a fourth subassembly 78. Fourth subassembly 78 is secured to dicing tape 38 with protective cover layer 74 exposed. Protective cover layer 74 is removed in FIG. 22 from spacer adhesive layer 22. Release adhesive 30 may be used between any of the various layers as appropriate. The remainder of the process steps for this embodiment generally parallels those described above with regard to FIGS. 14-17 and will therefore not be repeated.

The present invention recognizes that mounting a spacer die to some support surfaces, such as the support surface provided by a semiconductor substrate, raises different issues from mounting a spacer die to other support surfaces, such as provided by a circuit die. Some support surfaces to which a semiconductor spacer wafer may be mounted are not as smooth, that is are uneven, relative to other support surfaces. To accommodate such uneven surfaces, second spacer adhesive layer 60 may be selected to accommodate an uneven support surface. The main aspect used to accommodate uneven surfaces is the thickness of second spacer adhesive layer 60. A typical thickness for first spacer adhesive layer 22 is about 10 to 25 microns while a typical thickness for second spacer adhesive layer 60, when accommodating an uneven support surface, is at least about 35 microns. A typical thickness for second spacer adhesive layer 60 is about 40 microns, that is, at least about 50% greater than first spacer adhesive layer 22. Other physical characteristics of second spacer adhesive layer 60, such as low modulus of elasticity, soft material, may also be adjusted or modified to accommodate an uneven support surface. An example of a suitable film type adhesive for spacer adhesive layers 22, 60 can be obtained from National Starch & Chemical Company, Bridgewater, N.J. 08807 as Ablestik RP787-3DS.

As mentioned above, the present invention helps to protect wafer 10 during backgrinding operations and facilitates assembly of multi-chip packages. The present invention can also improve die stack quality for die chip, crack and film burr, and die stack design clearance without resin bleed.

Other modification and variation can be made to the disclosed embodiments without departing from the subject of the invention as defined in following claims. For example, spacer/adhesive die structure 46 and adhesive/spacer/adhesive die structure 62 may be used to support other spacer die as well as circuit die.

Any and all patents, patent applications and printed publications referred to above are incorporated by reference.

Other embodiments are within the scope of the invention.

What is claimed is:

1. A method for assembling a multi-chip semiconductor package comprising: obtaining a first subassembly comprising a semiconductor spacer wafer having first and second sides, a backgrinding tape layer and a spacer adhesive layer between the first side and the backgrinding tape layer; backgrinding the second side of the spacer wafer to create a second subassembly; securing the second subassembly to a dicing tape with the backgrinding tape layer exposed; removing the backgrinding tape from the spacer adhesive layer; forming an array of grooves extending from the spacer adhesive layer to at least the dicing tape layer and thereby creating spacers/adhesive die structures, the spacer/adhesive die structures comprising spacer die and adhesive; securing a spacer/adhesive die structure to a support surface with the spacer adhesive layer exposed; and positioning a second, circuit die against the adhesive of the spacer/adhesive die structure to secure the second, circuit die to the spacer die.

2. The method according to claim 1 further comprising: adhering a second spacer adhesive layer to the second side of the spacer wafer after the backgrinding step and before the first securing step, whereby the second spacer adhesive layer is used to secure the spacer/adhesive die structure to the support surface during the second securing step; and selecting at least the thickness of the second spacer adhesive layer to accommodate an uneven support surface of a semiconductor substrate.

3. A method of assembling a multi-chip semiconductor package, comprising:
providing a semiconductor spacer wafer;
disposing a first spacer adhesive layer on a first side of the semiconductor spacer wafer;
disposing a backgrinding tape on the first spacer adhesive layer;
backgrinding a second side of the semiconductor spacer wafer;
disposing a second spacer adhesive layer on the second side of the semiconductor spacer wafer;
securing the second spacer adhesive layer to dicing tape;
removing the backgrinding tape;
forming an array of grooves extending through the first spacer adhesive layer, semiconductor spacer wafer, and second spacer adhesive layer to the dicing tape, the array of grooves defining a plurality of spacer structures each including a first spacer adhesive layer, semiconductor spacer die, and second spacer adhesive layer;
mounting a first circuit die to a first side of the plurality of spacer structures; and
mounting a second circuit die to a second side of the plurality of spacer structures.

4. The method of claim 3, wherein the second spacer adhesive layer is thicker than the first spacer adhesive layer.

5. The method of claim 3, wherein the second spacer adhesive layer is at least about 35 microns thick.

6. The method of claim 3, further including disposing a release adhesive between the backgrinding tape and first spacer adhesive layer.

7. A method of assembling a multi-chip semiconductor package, comprising:
providing a semiconductor spacer wafer;
disposing a first spacer adhesive layer on a first side of the semiconductor spacer wafer;
disposing a second spacer adhesive layer on a second side of the semiconductor spacer wafer;
dicing through the first spacer adhesive layer, semiconductor spacer wafer, and second spacer adhesive layer to form a plurality of spacer structures, wherein the plurality of spacer structures each include the first spacer adhesive layer, semiconductor spacer die, and second spacer adhesive layer;
mounting a first circuit die to a first side of the plurality of spacer structures; and
mounting a second circuit die to a second side of the plurality of spacer structures.

8. The method of claim 7, further including:
disposing a backgrinding tape on the first spacer adhesive layer prior to disposing the second spacer adhesive layer on the second side of the semiconductor spacer wafer; and
backgrinding the second side of the semiconductor spacer wafer.

9. The method of claim 7, wherein the second spacer adhesive layer is thicker than the first spacer adhesive layer.

10. The method of claim 7, wherein the second spacer adhesive layer is at least about 35 microns thick.

11. The method of claim 7, further including disposing a release adhesive between the backgrinding tape and first spacer adhesive layer.

12. A method of assembling a multi-chip semiconductor package, comprising:
providing a semiconductor spacer wafer;
disposing a first spacer adhesive layer on a first side of the semiconductor spacer wafer;
dicing through the first spacer adhesive layer and semiconductor spacer wafer to form a plurality of spacer structures, wherein the plurality of spacer structures each include the first spacer adhesive layer, a semiconductor spacer die, and a second spacer adhesive layer;
mounting a first circuit die to a first side of the plurality of spacer structures;
disposing the second spacer adhesive layer on a second side of the semiconductor spacer wafer; and
securing the second side of the semiconductor spacer wafer to dicing tape prior to the dicing step.

13. The method of claim 12, wherein the second spacer adhesive layer is thicker than the first spacer adhesive layer.

14. The method of claim 12, wherein the second spacer adhesive layer is at least about 35 microns thick.

15. The method of claim 12, further including:
disposing a backgrinding tape on the first spacer adhesive layer prior to disposing the second spacer adhesive layer on the second side of the semiconductor spacer wafer; and
backgrinding the second side of the semiconductor spacer wafer.

16. The method of claim 15, further including disposing a release adhesive between the backgrinding tape and first spacer adhesive layer.

* * * * *